United States Patent [19]

Korechika

[11] Patent Number: 4,881,248
[45] Date of Patent: Nov. 14, 1989

[54] COUNTER CIRCUIT PROVIDED WITH MEANS FOR READING OUT COUNTED DATA BY READ-COMMAND SIGNAL APPLIED ASYNCHRONOUSLY WITH CLOCK SIGNALS TO BE COUNTED

[75] Inventor: Masako Korechika, Tokyo, Japan

[73] Assignee: NEC Corporation, Tokyo, Japan

[21] Appl. No.: 92,050

[22] Filed: Aug. 28, 1987

[51] Int. Cl.[4] ...................... H03K 21/12; H03K 21/40
[52] U.S. Cl. .......................................... 377/17; 377/45; 377/56; 377/28
[58] Field of Search ...................... 377/45, 56, 55, 17, 377/28

[56] References Cited

U.S. PATENT DOCUMENTS

| | | |
|---|---|---|
| 3,909,729 | 9/1975 | Fry ......................................... 377/56 |
| 4,339,011 | 7/1982 | Di Marzio ........................... 307/273 |
| 4,528,682 | 7/1985 | Nakaoki ................................ 377/45 |
| 4,592,078 | 5/1986 | Yamada ................................. 377/45 |
| 4,628,521 | 12/1986 | Nishimura et al. .................... 377/45 |

Primary Examiner—John S. Heyman
Attorney, Agent, or Firm—Helfgott & Karas

[57] ABSTRACT

Disclosed is a combination of a counter operating in response to an input signal, a latch circuit for latching the output of the counter and a read-command signal inhibiting circuit controlling the latch circuit so as not to effect the latch operation for a predetermined period from the input signal for a time necessary for the operation of the counter, in response to a read-command signal.

5 Claims, 4 Drawing Sheets

COUNTER CIRCUIT PROVIDED WITH MEANS FOR READING OUT COUNTED DATA BY READ-COMMAND SIGNAL APPLIED ASYNCHRONOUSLY WITH CLOCK SIGNALS TO BE COUNTED

BACKGROUND OF THE INVENTION

The present invention relates to a counter circuit, and more particularly to a counter circuit used in a system for inputting positional information into a data processing apparatus.

Among Input/Output peripheral systems for the data processing apparatus, a wide variety of positional information input systems are utilized, for example, as a so-called "mouse" for a personal computer and as a numerical position detector in a drafting machine, a NC machine and an industrial robot. The positional information is generally detected in form of electrical pulse signals which are applied to a counter circuit to be counted. The counter circuit outputs the counted digitial data to the data processing apparatus as an input positional information. The counting operation of the counter circuit is executed in response to the detection of the positional information, while the output operation of the counter circuit to the data processing apparatus is performed by a read-command signal generated by the data processing apparatus.

A predetermined operation time is necessary in the counter circuit for the counting operation. If the read-command signal is applied during the counting operation, the outputted data bears meaningless information. Since there is no specific relationship between the counting operation and the read-command signal timing, the read-command signal is applied from time to time during the counting operation of the counter. In such a case, the bits before the counting operation and the bits after the counting operation co-exist in mixture in the output of the counter circuit and hence the output becomes meaningless.

It is possible to synchronize the counting operation of the counter circuit with the read-command signal by using such sampling clocks in detection of the positional information to obtain pulse signals that is in synchronism with the clock signal used in the data processing apparatus. However, in such a case, a clock which is in synchronism with the data processing apparatus must be generated inside a chip. Therefore, the circuit construction becomes complicated.

SUMMARY OF THE INVENTION

It is therefore, an object of the present invention to provide a center circuit from which an accurate counted data is read out by a read-command signal which is applied asynchronously with the counting operation.

It is another object of the present invention to provide a counter circuit capable of outputting an accurate counted data in response to a read-command signal given at an arbitrary timing thereto.

In accordance with the present invention, the counter circuit is provided with output latches which receive the counted data of the counter circuit and output it to the data processing apparatus, and a read-command signal inhibiting circuit receiving the read-command signal and generating a controlled read-command signal to enable the output latches in order that the output latches do not latch the counted data for the period of time necessary for the counting operation after the pulse signals to be counted are applied to the counter circuit.

In accordance with the present invention, the output latches do not store the counted data for a predetermined period of time necessary for the counting operation. Accordingly, after the change of the counted data is completed, the changed counter output can be latched and outputted to the data processing apparatus.

BRIEF DESCRIPTION OF THE DRAWINGS

The above and other objects, features and advantages of the present invention will become more apparent from the following detailed description taken in conjunction with the accompanying drawings, wherein.

DESCRIPTION OF THE PREFERRED EMBODIMENT

Figure 1:
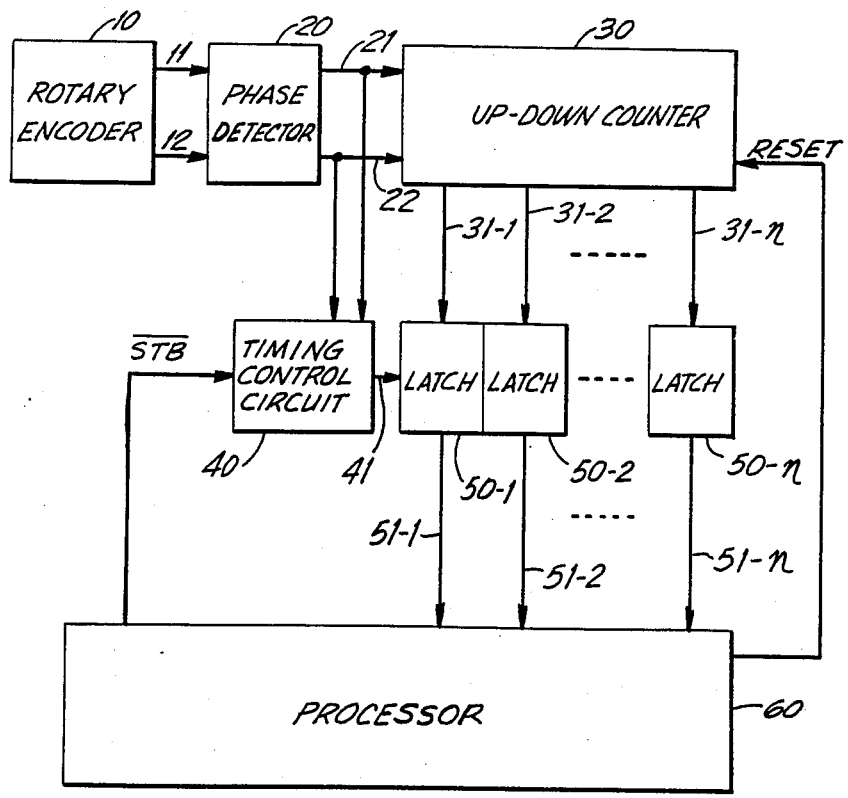
FIG. 1 is a block diagram of a positional information input system employing a counter circuit in accordance with a preferred embodiment of the present invention.
Figure 2A:
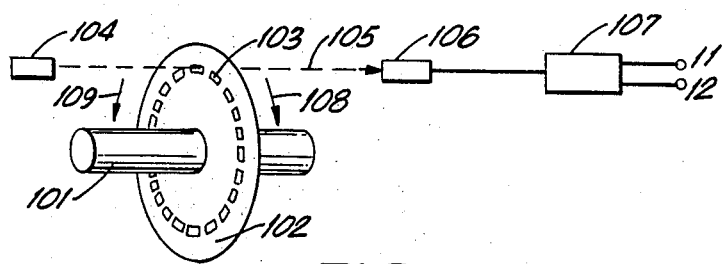
FIG. 2(a) is a schematic view of a rotary encoder used in the system of FIG. 1.
Figure 2B:
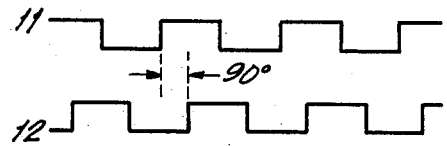
FIG. 2(b) is an output waveform diagram of the rotary encoder of FIG. 2(a)

Referring to FIG. 1, the positional information input system according to the preferred embodiment of the invention comprises an incremental type rotary encoder 10 generating two kinds of pulses 11 and 12 representive of position information, a phase detector circuit 20 converting the pulses 11 and 12 into an up-count clock 21 and a down-count clock 22, respectively, and an up-down counter 30 up- and down-counting the input clocks 21 and 22. Thus, the position information is converted into a digital data as an counted output. The counted output is read out of the counter 30 to the latch circuits 50-1, 50-2, . . . 50-n which are coupled to the respective ones of n-stages of the counter 30. If a two-dimensional position is to be detected, two positional information should be inputted for X- and Y-axis directions. Each positional information for each axis is detected as an amount of rotation and a direction of rotation and encoded by the incremental type rotary encoder 10 disposed for each axis. As shown in FIGS. 2(a) and 2(b), the incremental type rotary encoder 20 includes a rotary shaft 101 and a rotating code disc 102 with slits 103 formed therein and detects the amount of rotation and rotating direction of a rotary shaft 101 by use of light 105 emitted from a light emitter 104 and passing through the slits 103. The passed light 105 is detected by a photo-detector 106 and converted into electric signals which are, in turn, outputted as pulse signals 11 and 12 phases of which are different from each other by 90°, by an output circuit 107. The slits 103 are arranged so that when the shaft 101 rotates in one direction 108, the phase of the signal 11 advances by 90° with respect to the signal 12 and when it rotates in the opposite direction 109, the phase of the signal 11 is retarded by 90° to the signal 12. Accordingly, the rotating direction can be detected from the phase relationship between the pulses 11 and 12. On the other hand, the amount of rotation can be detected by counting the number of pulses of the signal 11 or 12. These pulse signals 11 and 12 having the two phases are converted by the phase detector circuit 20 into the up-count clock 21 when the rotary shaft 101 rotates in the direction and to the down-count clock 22 when the rotary shaft 101 rotates in the opposite direction. At this time, the number of pulses of the up-count clock 21 and the down-count clock 22 is made to be proportional to the number of pulses of the signal 11 or 12. Therefore, the positional information in one direction, such as in the X direction, can be detected by counting the up-count clock 21 and the down-count clock 22 by the up-down counter 30. The two-dimensional position information can be detected by detecting likewise the positional information in the Y direction.

The counted value 31-1, 31-n of this up-down counter 30 is latched to the latch circuits 50-1, ... 50-n, each of which has a transfer gate and a latch, in response to a strobe signal $\overline{STB}$ which is generated by a processor 60 at a certain timing as a read-command signal to read the counted value into the processor 60. The up-down counter 30 is driven by the up-count clock 21 or the down-count clock 22, and a predetermined period of time is necessary before the counted data of the up-down counter 30 is completely changed in response to the input clock 21 or 22 and stabilized. The clock signal of the up-count clock 21 or down-count clock 22 is such a signal as obtained by converting the positional information, which changes from time to time on a time sequence irrelevant to the timing sequence of the processor 60. Therefore, this clock signal 21 or 22 is asynchronous with the strobe signal $\overline{STB}$. Accordingly, if the strobe signal $\overline{STB}$ is directly applied to the latch circuits 50 to latch the counted data of the up-down counter 30 during the period in which the counted data of the up-down counter 30 is being changed after the input of the clock signal, it would become indefinite whether the counted data latched by the latch circuits 50 is the counted data before the change by the clock signal or the count data after the change. Moreover, this indefiniteness would appear for each bit (each stage of the counter 30) to make the output of the counted data meaningless.

According to the invention, a read command signal inhibiting circuit 40 is provided to inhibit the strobe signal $\overline{STB}$ so that the latch circuits 50 operate only after the counted data of the up-down counter 30 is changed and stabilized. The read-command signal inhibiting circuit 40 receives the up-count clock 21 and the down-count circuit 22 as well and inhibits the input strobe signal $\overline{STB}$, if either the up-count clock or the down-count clock has reached there before the receipt of the strobe signal $\overline{STB}$, until the up-down counter 30 terminates the up-counting operation or the down-counting operation in response to the same up-count clock or down-count clock and the count-data is changed and stabilized. Thus, the read-command signal inhibiting circuit 40 outputs a controlled, strobe signal 41. The latch circuits 50 are enabled by the controlled strobe signal 41 to latch the counted data 31 of the up-down counter 30.

While the up-down counter 30 operates with the up-count clock 21 or the down-count clock 22, the strobe signal $\overline{STB}$ from the controller 60 is inhibited by the read-command signal inhibiting circuit 40 whose output 41 is applied to the latch circuits 50 only after the counted data 31 of the up-down counter 30 has been changed. Accordingly, the counted data of the up-down counter 30 after the change is latched by the latch circuits 50. Therefore, in response to the strobe signal $\overline{STB}$ which is generated asynchronously with the clock signal 21 or 22, the positional information as converted into digital data 51-1, ... 51-n is inputted to the processor 60. In this manner, the positional information, which changes at the timing asynchronous to the processor 60, is inputted into the processor 60.

Figure 3:
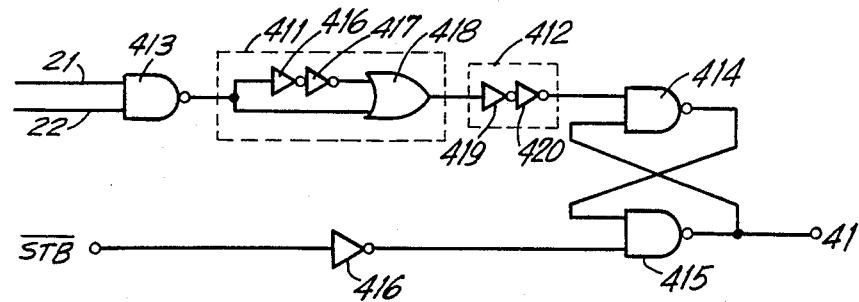
FIG. 3 is a circuit diagram showing an example of a read-command signal inhibiting circuit used in the embodiment of the present invention.
Figure 4:
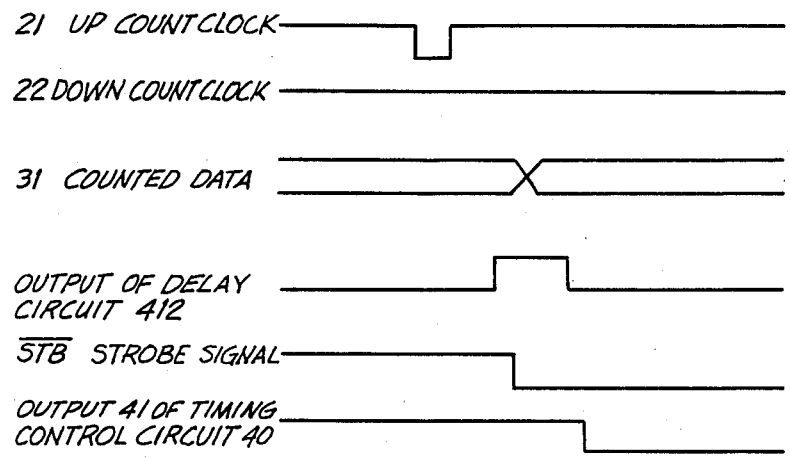
FIG. 4 is a timing chart of the timing control circuit shown in FIG. 3.

Referring to FIG. 3 and FIG. 4, a preferred example of the timing control circuit 40 will be described. The up-count clock 21 and the down-count clock 22 are applied to a NAND gate 413. Since the up-count clock 21 and the down-count clock 22 are negative pulses, this NAND gate 413 functions as an OR gate. Therefore, when either of the negative pulses 21, 22 is applied, a positive pulse is outputted. The pulse width of this output is expanded by a pulse width extending circuit 411 to a width longer than the time in which the counted data of the up-down counter 112 starts being changed by the up-counter clock 21 or the down-count clock 22 and ends being changed. This circuit 411 consists, for example, of two inverters 416, 417 for delaying the output of the NAND gate 413 and an OR gate 418 to which the output of the inverter 417 and the output of the NAND gate 413 are applied, as shown in FIG. 4. The pulse width can be adjusted by adjusting the delay time of the delay circuit 416, 417. The up-down counter 30 starts the counting operation in response to the falling edge of the clock signal 21 or 22. In each bit (each stage) of the counter 30, the change in its state is started from the rising edge of a clock pulse applied to a clock pulse terminal CP of a flip-flop $FF_1$ or $FF_2$ or $FF_3$ or . . . (see FIG. 7) of that stage and ended several to ten nanoseconds later. It needs several nanoseconds to allow deviations in the time necessary for each stage and also further several nanoseconds are necessary to allow deviation in the pulse width of the clocks 21 and 22. In consideration of deviations resulting from the production process, further, the expanded pulse width is set to be from 20 to 50 nanoseconds. However, if the pulse width of the up-count clock 21 or down-count clock 22 is sufficiently great, the pulse width expanding circuit 411 need not be used. Furthermore, the same effect can be obtained by expanding the pulse width of the clock signal 21, 22 before it enters the read-command signal inhibiting circuit 40.

The output pulse of the pulse width expanding circuit 411 is applied to a delay circuit 412 to synchronize it with the operating timing of the up-down counter 30, that is, with the timing of the change in the counted data. The delay time is set to be from 10 to 20 nanoseconds, for example. This delay circuit 412 consists, for example, of two inverters 419 and 420.

The output of the delay circuit 412 is applied to one of the input terminals of a flip-flop composed of cross-connected NAND gates 414 and 415 and the strobe signal $\overline{STB}$ is applied to the other input terminal through the inverter 416. When the output of the delay circuit 412 is at the "High" level, the output 41 of the timing read-command signal inhibiting circuit 40 remains at the "High" level even when the strobe signal $\overline{STB}$ is changed from the "High" level to the "Low" level. When the output of the delay circuit 412 is turned to the "Low" level, the output 41 of the read-command signal inhibiting circuit 40 is changed to the "Low" level in response thereto to enable the latch circuits 50 which thereby latch the counted data 31 of the up-down counter 30. As is described, the read-command signal inhibiting circuit 40 generates, in response to a up-count or down-count clock, such a pulse (i.e., the output of the delay circuit 412) that covers the changing timing of the counted data of the counter 30 which is changed in response to the same up-count or down-count clock, and the circuit 40 holds the strobe signal $\overline{STB}$ which is applied thereto within the duration of that pulse till that pulse disappears.

Figure 5:
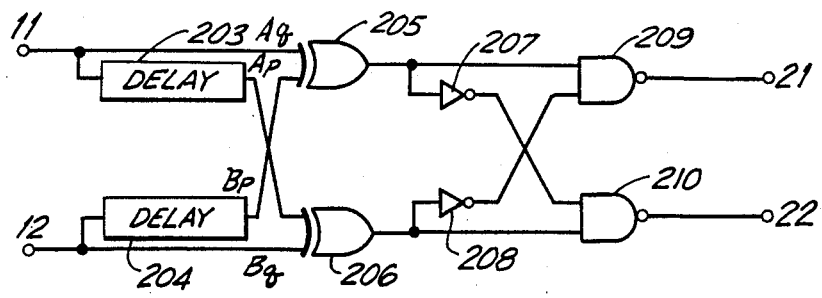
FIG. 5 is a circuit diagram showing an example of a phase detector circuit used in the embodiment of the present invention.
Figure 6:
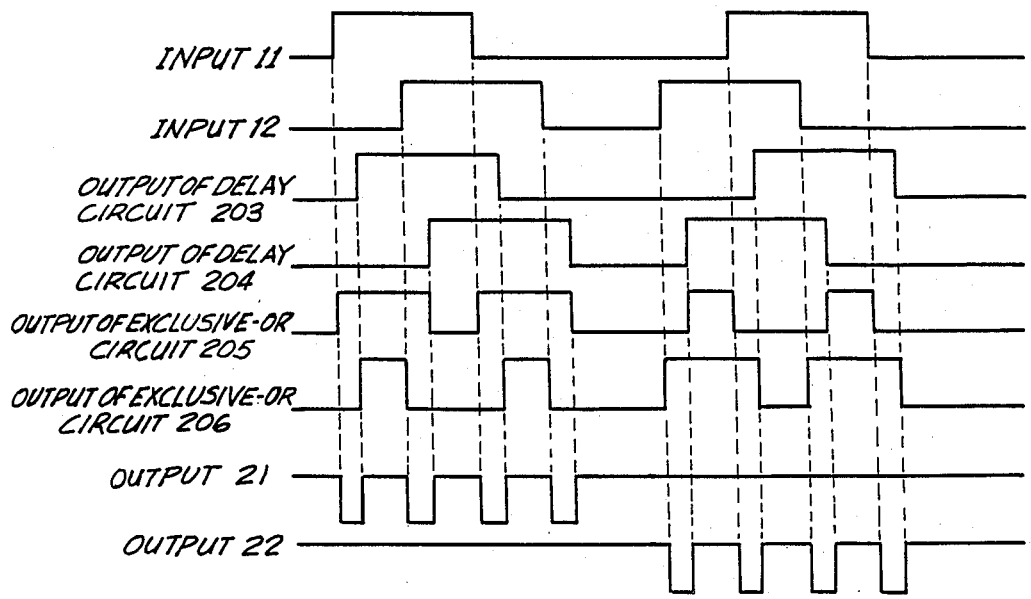
FIG. 6 is a timing chart of the phase detector circuit shown in FIG. 5.

FIG. 5 is a circuit diagram showing a preferred example of the phase detector circuit 20 and FIG. 6 shows its timing chart. The signals 11 and 12 are applied to input terminals therof and delayed for a predetermined period by delay circuits 203 and 204, respectively. This delay time determines the pulse width of the output pulse signals 21 and 22 obtained at output terminals. The input signal 11 and the output signal of the delay circuit 204 are applied to an exclusive-OR gate 205 and the other input signal 12 and the output signal of the delay circuit 203 are applied to an exclusive-OR gate 206. Assuming that the input signals 11 and 12 at an arbitrary time are $A_q$ and $B_q$ and the output signals of the delay circuits 203 and 204 are $A_p$ and $B_p$, respectively, the exclusive-OR-ed signal $A_q \oplus B_p$ between the signals $A_q$ and $B_p$ and the exclusive-OR-ed signal $A_p \oplus B_q$ between the signals $A_p$ and $B_q$ are generated by the exclusive-OR circuits 205 and 206, respectively. The output of each exclusive-OR circuit 205, 206 is inverted by an inverter 207, 208, and NAND logic operation is executed between the output of the exclusive-OR circuit 205 and the output of the inverter 208 and between the output of the exclusive-OR circuit 206 and the output of the inverter 207. As a result, the signal $\overline{(A_q \oplus B_p)} + (A_p \oplus B_q)$ is obtained at the output of the NAND circuit 209 as the output signal 21 and the signal $(A_q \oplus B_p) + \overline{(A_p \oplus B_q)}$ as the other output 22, at the output of the NAND circuit 210. In this manner, the negative pulse is generated as the output signal 21 or 22 in accordance with the phase difference of the input signals 11 and 12.

Figure 7:
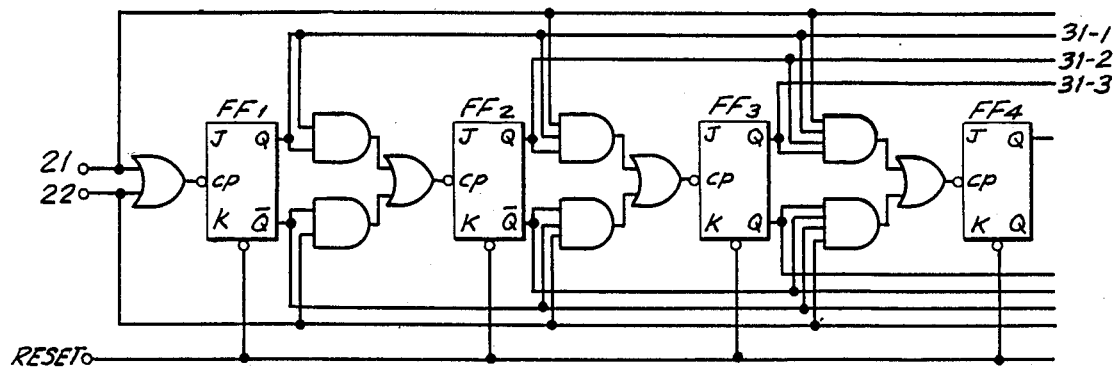
FIG. 7 is a circuit diagram showing an example of an up-down counter used in the embodiment of the present invention.

FIG. 7 is a circuit diagram showing a preferred example of the up-down counter 30. A synchronous type up-counter is so formed that the results of the AND logic between the output Q's of each J-K flip-flop ($FF_1$, $FF_2$, $FF_3$, $FF_4$) of each stage and the output from the up-count clock 21 are applied to the clock input CP of the J-K flip-flop of the subsequent stage, while a synchronous type down-counter is so formed that the results of the AND logic between the output $\overline{Q}$ of each J-K flip-flop and the down-count clock 118 are applied to the clock input CP of the subsequent J-K flip-flop. According to this construction, the up-count clock 21 or the down-count clock 22 can control the counting direction. The counted data of each stage, i.e., each bit 31-1, 31-2, 31-3, ... of the counted data is derived from the Q output terminal of the flip-flop of each stage and transferred to each one of the latch circuits 50. A reset signal is applied from the processor 60 to the RESET terminal to reset all the flip-flops at the very beginning of the operation.

Figure 8:
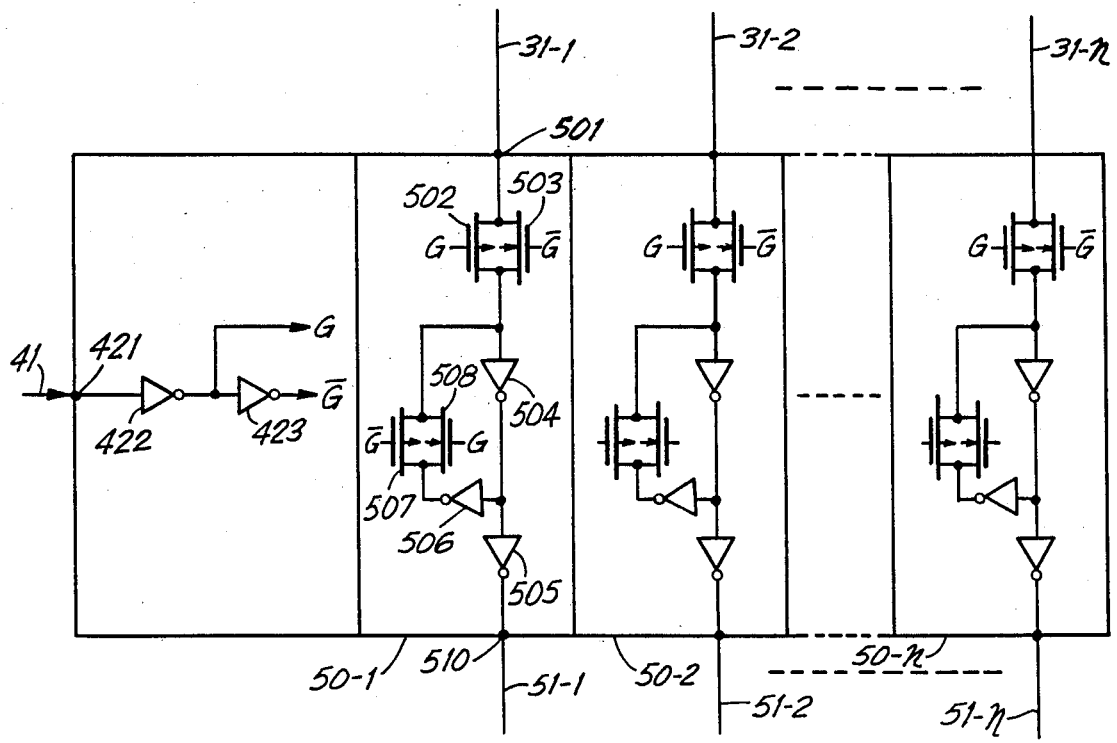
FIG. 8 is a circuit diagram showing an example of latch circuits used in the embodiment of the present invention.

Referring to FIG. 8, each one 50-1, 50-2, ... 50-n of the latch circuits comprises an input end 501 receiving each bit of the output data 31-1, 31-2, ... or 31-n of the counter 30, a pair of parallel-connected complementary MOS transistors 502 and 503 as a first transfer gate, an inverter 504 connected through the first transfer gate to the input end 501, two inverters 505 and 506 connected in common to the output terminal of the inverter 504, an output end 510 connected to the output terminal of the inverter 505 to derive an output 51-1, 51-2, ..., or 51-n to the processor 60, and another pair of parallel-connected complementary MOS transistors 507 and 508 as a second transfer gate inserted between the output terminal of the inverter 506 and the input terminal of the inverter 504. The output 41 of the read-command signal inhibiting circuit 40 is applied to an enable terminal 421 and inverted by an inverter 422 to produce an enable signal G which is further inverted by an inverter 423 to generate a complementary enable signal $\overline{G}$. The pair of the enable signals G and $\overline{G}$ are applied to gates of the complementary MOS transistors 502 and 503 of the first transfer gate and those of the transistors 507 and 508 of the second transfer gate in each latch. When the output 41 of the timing control circuit 40 is inactive, that is, in the "High" level, G and $\overline{G}$ take the "Low" and "High" levels, respectively, and make the first transfer gate "ON" and the second transfer gate "OFF", with a result that the output data at the input end 501 appears at the output and through the first transfer gate and the inverters 504 and 505 without being latched. When the output 41 becomes active, that is, in the "Low" level, G and $\overline{G}$ are turned into the "High" and "Low" levels, respectively, and bring the first transfer gate into "OFF" state and the second transfer gate into "ON" state. As a result, the data at the input end 501 in each latch just before G and $\overline{G}$ are changed over is latched in a flip-flop which is composed by the inverters 504 and 506 through the conductive second transfer gate. The processor 60 generates a read-command signal (i.e., a strobe signal STB) to make the output 41 active only when the processor 60 requires the counted value, and the latched data is read into the processor 60. On the other hand, when the processor 60 does not need to read the counted values, the processor 60 does not receive the outputs 51-1, 51-2, ... 51-n, even when these outputs are available to the processor 60

Although the present invention has thus been described in its preferred form, the invention is not particularly limited thereto. For example, the latch circuit may be a switch which is subjected to ON/OFF control by the output of the timing control circuit or a shift register which receives in parallel the outputs of the up-down counter by the output of the timing control circuit and derives in series the counted data. In short, it may be of such a type that can control the input timing of the output of the up-down counter to a data processing unit.

What is claimed is:

1. A positional information input circuit comprising:
   a rotary encoder for generating two kinds of pulse signals representative of positional information;
   a counting signal generation circuit coupled to said rotary encoder and generating an up-counting signal or a down-counting signal in response to said two kinds of pulse signals;
   an up-down counter executing up-counting and down-counting in response to said up-counting signal and said down-counting signal, respectively;

a processor generating a read-command signal to read a counted value of said up-down counter into said processor;

a read-command signal inhibiting circuit receiving said read-command signal from said processor and generating a controlled read-command signal;

a plurality of latch circuits coupled to respective stages of said up-down counter and enabled when said controlled read-command signal is applied thereto;

a first applying means coupled to said read-command signal inhibiting a circuit and said latch circuits for applying said controlled read-command signal to said latch circuits; and a second applying means coupled to said counting signal generation circuit, said up-down counter and said read-command signal inhibiting circuit for applying said up-counting signal and said down-counting signal to both said up-down counter and said read-command signal inhibiting circuit;

said read-command signal inhibiting circuit inhibiting said read-command signal, when at least one of said up-counting signal and down-counting signal was applied to said read-command signal inhibiting circuit, until said up-down counter terminates an execution of the up-counting or down-counting in response to the same up-counting or down-counting signal which has been applied to said read-command signal inhibiting circuit and thereafter generating said controlled read-command signal.

2. The circuit of claim 1, wherein said read-command signal inhibiting circuit includes a third means coupled to said second applying means for generating a first pulse in response to said at least one of said up-counting signal and down-counting signal for a time period in which said up-down counter starts the execution of the up-counting or down-counting in response to the same up-counting or down-counting signal and terminates the execution of the up-counting or down-counting in response to the same up-counting or down-counting signal, and a fourth means coupled to said third means and receiving said first pulse and said read-command signal for inhibiting said read-command signal received at a time when said first pulse disappears.

3. The circuit of claim 2, wherein said fourth means includes a first NAND gate receiving said first pulse at one of two input terminals thereof and a second NAND gate receiving said read-command signal at one of two input terminals thereof, and wherein another input terminal of said first NAND gate is connected to an output of said second NAND gate, another input terminal of said NAND gate is connected to an output of said first NAND gate, and an output terminal of said second NAND gate is connected to said first applying means.

4. The circuit of claim 3, wherein said third means includes a fifth means for generating a third pulse in response to said at least one of said up-counting signal and down-counting signal, and a delay circuit for delaying said third pulse for a predetermined period.

5. The circuit of claim 4, wherein said third means further includes a pulse width expanding circuit disposed at a pre-state of said delay circuit for expanding a pulse width of said third pulse.

* * * * *

UNITED STATES PATENT AND TRADEMARK OFFICE
CERTIFICATE OF CORRECTION

PATENT NO. : 4,881,248

DATED : November 14, 1989

INVENTOR(S) : MASAKO KORECHIKA

It is certified that error appears in the above-identified patent and that said Letters Patent is hereby corrected as shown below:

On the title page

Item [30] Foreign Application Priority Data

Aug. 28, 1986 [JP] Japan...........203003/1986

Signed and Sealed this

Eighteenth Day of June, 1991

*Attest:*

HARRY F. MANBECK, JR.

*Attesting Officer*      *Commissioner of Patents and Trademarks*